United States Patent
Whitfield et al.

(10) Patent No.: US 8,432,654 B2
(45) Date of Patent: Apr. 30, 2013

(54) MULTI-VOLTAGE ELECTROSTATIC DISCHARGE PROTECTION

(75) Inventors: James D. Whitfield, Gilbert, AZ (US); Chai Ean Gill, Chandler, AZ (US); Abhijat Goyal, Chandler, AZ (US); Rouying Zhan, Gilbert, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 13/612,466

(22) Filed: Sep. 12, 2012

(65) Prior Publication Data

US 2013/0010394 A1 Jan. 10, 2013

Related U.S. Application Data

(62) Division of application No. 12/112,209, filed on Apr. 30, 2008, now Pat. No. 8,279,566.

(51) Int. Cl.
*H02H 9/00* (2006.01)

(52) U.S. Cl.
USPC .............................. 361/56; 361/91.1; 361/111

(58) Field of Classification Search .................. None
See application file for complete search history.

(56) References Cited

U.S. PATENT DOCUMENTS

| | | | |
|---|---|---|---|
| 5,086,365 A | 2/1992 | Lien | |
| 5,686,751 A | 11/1997 | Wu | |
| 6,160,434 A | 12/2000 | Yoshimura et al. | |
| 6,459,553 B1* | 10/2002 | Drapkin et al. | 361/56 |
| 6,621,675 B2 | 9/2003 | Ingino, Jr. | |
| 6,747,857 B1* | 6/2004 | Lee et al. | 361/56 |
| 6,844,597 B2 | 1/2005 | Baird et al. | |
| 7,027,278 B1* | 4/2006 | Vashchenko et al. | 361/56 |
| 7,221,551 B2* | 5/2007 | Chen | 361/230 |
| 7,288,820 B2 | 10/2007 | Baird et al. | |
| 7,945,232 B2 | 5/2011 | Sugiyama et al. | |
| 2006/0087788 A1* | 4/2006 | Gibet et al. | 361/100 |
| 2008/0029820 A1* | 2/2008 | Disney et al. | 257/355 |
| 2008/0259511 A1* | 10/2008 | Worley | 361/56 |

FOREIGN PATENT DOCUMENTS

JP 2005-260039 9/2005

OTHER PUBLICATIONS

PCT Application No. PCT/US2009/034669 mailed Sep. 29, 2009.
USPTO "Non-Final Office Action" mailed Jan. 18, 2012; U.S. Appl. No. 12/112,209, filed Apr. 30, 2008.
Response to "Non-Final Office Action" filed May 18, 2012 for U.S. Appl. No. 12/112,209, filed Apr. 30, 2008.
USPTO "Notice of Allowance" mailed Jun. 8, 2012; U.S. Appl. No. 12/112,209, filed Apr. 30, 2008.

* cited by examiner

*Primary Examiner* — Stephen W Jackson
*Assistant Examiner* — Terrence Willoughby
(74) *Attorney, Agent, or Firm* — Ingrassia Fisher & Lorenz, P.C.

(57) ABSTRACT

An electrostatic discharge (ESD) clamp, coupled across input-output (I/O) and common (GND) terminals of a protected semiconductor device or integrated circuit is provided. One ESD clamp comprises an ESD transistor (ESDT) with source-drain coupled between the GND and I/O terminals, a first resistor coupled between the gate and source and a second resistor coupled between the ESDT body and source. Paralleling the resistors are control transistors with gates coupled to one or more bias supplies Vb, Vb'. The main power rail (Vdd) of the device or IC is a convenient source for Vb, Vb'. When the Vdd is off during shipment, handling, equipment assembly, etc., the ESD trigger voltage Vt1 is low, thereby providing maximum ESD protection when ESD risk is high. When Vdd is energized, Vt1 rises to a value large enough to avoid interference with normal circuit operation but still protect from ESD events.

20 Claims, 5 Drawing Sheets

MULTI-VOLTAGE ELECTROSTATIC DISCHARGE PROTECTION

CROSS-REFERENCE TO RELATED APPLICATION

This application is a divisional of co-pending U.S. application Ser. No. 12/112,209, filed Apr. 30, 2008.

FIELD OF THE INVENTION

The present invention generally relates to electrostatic discharge (ESD) protection of electronic elements and, more particularly, ESD protection of semiconductor components and integrated circuits.

BACKGROUND OF THE INVENTION

Modern electronic devices, especially semiconductor (SC) devices and integrated circuits (ICs) are at risk of damage due to electrostatic discharge (ESD) events. It is well known that electrostatic discharge from handling SC devices and ICs, by humans or machines or both, is a source of such excess voltage. Accordingly, it is commonplace to provide an ESD clamp (voltage limiting device) across the input/output (I/O) and other terminals of such SC devices and IC's.

Figure 1:
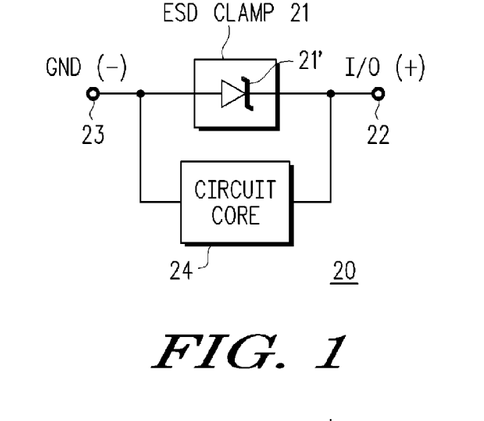
FIG. 1 is a simplified schematic diagram of a generalized ESD protection circuit using an ESD clamp to protect a circuit core from electrostatic discharge (ESD) events.

FIG. 1 is a simplified schematic diagram of circuit 20 wherein ESD clamp 21 is placed between input/output (I/O) terminals 22 and ground or common terminal 23 of a SC device or IC to protect the other devices on the chip, that is, to protect circuit core 24 which is also coupled to I/O terminals 22 and common (e.g., "GND") terminal 23. I/O terminals 22 may also be referred to more generally as "first terminals" 22 and include other functions in addition to input and output, and GND terminal 23 may also be referred to more generally as "second terminal" 23 and include other functions besides connection to a common or reference potential or bus. Zener diode symbol 21' within ESD clamp 21 symbolically indicates that the function of ESD clamp 21 is to limit the voltage than can appear across circuit core 24 irrespective of the voltage existing at external terminals 22, 23. ESD clamp 21 may or may not include an actual Zener diode. As used herein, the abbreviation "GND" is intended to refer to the common or reference terminal of a particular circuit or electronic element, irrespective of whether it is actually coupled to an earth return and the abbreviation "I/O" is intended to include any terminals of the SC device or IC protected by an ESD clamp.

Figure 2:
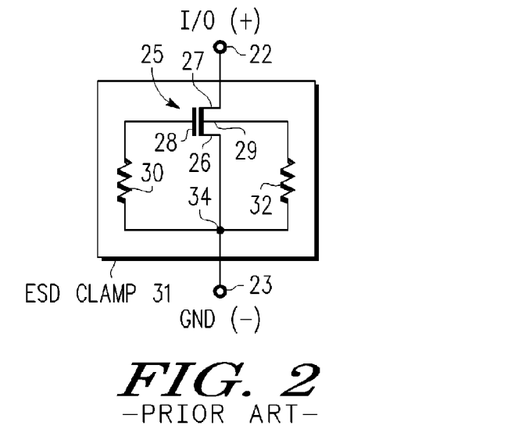
FIG. 2 is a simplified schematic diagram illustrating internal components of a prior art ESD clamp.
Figure 3:
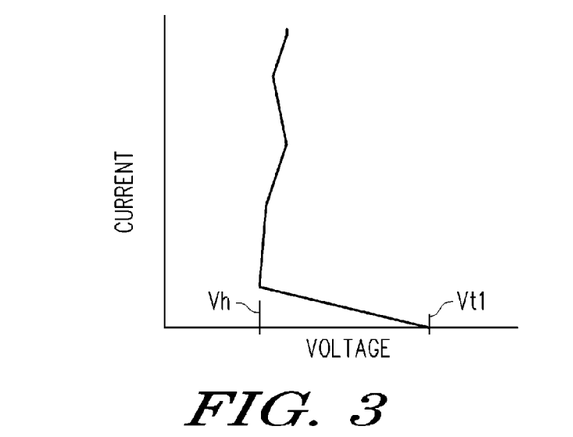
FIG. 3 is an illustration of a typical current-voltage characteristic of and ESD clamp such as, for example, is shown in FIG. 2.

FIG. 2 is a simplified schematic diagram illustrating internal components of prior art ESD clamp 31 that is inserted in circuit 20 in place of ESD clamp 21. ESD clamp 31 comprises field effect transistor 25, having source 26, drain 27, gate 28, body contact 29, and parallel resistances 30, 32. Resistance 30 is coupled from gate 28 to node 34, which is in turn coupled to GND terminal 23 and source 26. Resistance 32 is coupled from body contact 29 of transistor 25 to node 34 which is in turn coupled to GND terminal 23 and source 26. When the voltage across terminals 22, 23 rises beyond a predetermined limit referred to as the "trigger voltage Vt1", transistor 25 turns on, desirably clamping the voltage across terminals 22, 23 at a level below a value capable of damaging circuit core 24. The lateral size of transistor 25 is chosen to be capable of sinking the expected ESD current without allowing the voltage across terminals 22, 23 to rise above the trigger voltage Vt1. Such ESD clamps are well known in the art. FIG. 3 is an illustration of a typical current-voltage characteristic of an ESD clamp, where voltage Vt1 is referred to as the trigger voltage and voltage Vh is referred to as the holding voltage.

BRIEF DESCRIPTION OF THE DRAWINGS

The present invention will hereinafter be described in conjunction with the following drawing figures, wherein like numerals denote analogous elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

While the circuit of FIG. 2 can be very effective in providing ESD protection, further improvements are needed. Accordingly, there is an ongoing need to provide improved ESD clamp circuits, especially ESD clamp circuits with reduced parasitic loading of the core circuit they are intended to protect, ESD clamps that can provide multiple ESD trigger voltages under different conditions, and ESD clamps that can provide more robust protection when the SC device or IC is inactive, that is, not connected to its normal power supply. Furthermore, other desirable features and characteristics of the present invention will become apparent from the subsequent detailed description of the invention and the appended claims, taken in conjunction with the accompanying drawings and this background of the invention.

For convenience of description, it is assumed herein that the ESD clamp devices comprise N-channel field effect transistors. But this is not intended to be limiting, and persons of skill in the art understand that P-channel devices can also be utilized with an appropriate interchange of N and P semiconductor regions and polarity of applied voltages. Accordingly, the description herein embodying various field effect transistors (FETs) is intended to apply to either type of device with appropriate modification of supply and signal polarity. Like wise, NPN and PNP transistors can be used in place of N and P channel devices with minor impact on operation or adjustments to the circuit.

Figure 4:
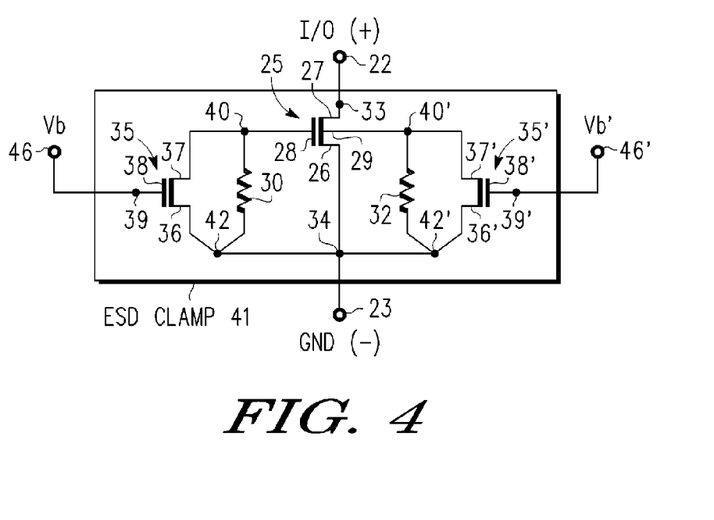
FIG. 4 is a simplified schematic diagram illustrating internal components of an ESD clamp, according to an embodiment of the invention.

FIG. 4 is a simplified schematic diagram illustrating internal components of ESD clamp 41 according to an embodiment of the invention. ESD clamp 41 is used in generalized protection circuit 20 in place of ESD clamp 21, wherein node 33 is coupled to I/O terminal 22 and node 34 is coupled to GND terminal 23. ESD clamp 41 differs from prior art ESD clamp 31 of FIG. 2 in that it includes further transistors 35, 35' having sources 36, 36', drains 37, 37' and gates 38, 38', respectively. To facilitate explanation, transistors 35, 35' are hereafter referred to as "control transistors", singular or plural, since they can be used to adjust or control the trigger voltage Vt1, and transistor 25 is referred to as the "ESD transistor" since it is the device through which the ESD transient discharge current is intended to flow. Control transistor 35 is coupled in parallel with resistor 30, that is, from node 40 coupled to a first end of resistor 30 and gate 28 of ESD transistor 25, to node 42 coupled to the other end of resistor 30 and to node 34, which is in turn coupled to source 26 of ESD transistor 25 and to GND terminal 23 of ESD clamp 41. Control transistor 35' is coupled in parallel with resistor 32, that is, from node 40' coupled to a first end of resistor 32 and body contact 29 of ESD transistor 25, to node 42' coupled to the other end of resistor 32 and to node 34 which is in turn coupled to source 26 of ESD transistor 25 and to GND terminal 23 of ESD clamp 41. Gates 38, 38' are coupled via gate nodes 39, 39' to bias supplies Vb, Vb' at bias supply terminals 46, 46'. As is more fully explained in connection with FIG. 7, changing the value of Vb, Vb' causes the ESD circuit trigger voltage Vt1 to change, that is, the larger the value of Vb, Vb', the higher the value of Vt1. In a preferred embodiment, Vb and Vb' are obtained from a common supply and are substantially the same, but in other embodiments separate bias voltage supplies and/or different bias voltage values may be used.

Figure 5:
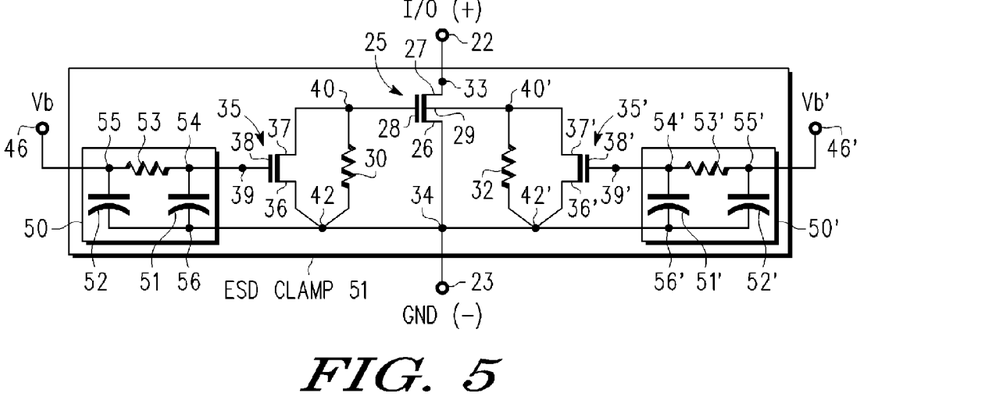
FIG. 5 is a simplified schematic diagram illustrating internal components of an ESD clamp, according to a further embodiment of the invention.

FIG. 5 is a simplified schematic diagram illustrating internal components of ESD clamp 51, according to a further embodiment of the present invention. ESD clamp 51 is used in generalized protection circuit 20 in place of ESD clamp 21, wherein node 33 is coupled to I/O terminal 22 and node 34 is coupled to GND terminal 23. ESD clamp 51 of FIG. 5 differs from ESD clamp 41 of FIG. 4 by the addition of RC filters 50, 50' intended to remove any high speed transients that may be present on Vb, Vb' or the lead coupling nodes 39, 39' to Vb, Vb'. Filters 50, 50' act as low-pass filters and conveniently comprise series resistances 53, 53' coupled between gate nodes 39, 39' of control transistors 35, 35' and bias terminals 46, 46', respectively, and one or more shunt capacitances 51, 51'; 52, 52' coupled between nodes 54, 54'; 55, 55' and common nodes 42, 42' via nodes 56, 56', that is, across gate-source terminals 38, 36 and 38', 36', via nodes 39, 39' and 42, 42' of control transistors 35, 35'. The desired values of R and C depend upon the desired operating frequency of core circuit 24 (and ESD clamp 51) and the expected harmonics or transients that may occur on bias supplies Vb, Vb'. When operating frequencies are in the range of about 800 mega-Hertz and above, convenient values for R and C in filters 50, 50' are: usefully in the range of about $200 \leq R \leq 200$ k Ohms and $0 \leq C \leq 2$ nano-Farads; conveniently in the range of about 5 $k \leq R \leq 40$ k Ohms and $0 \leq C \leq 0.5$ nano-Farads, and preferable in the range of about 5 $k \leq R \leq 20$ k Ohms and $0.1 \leq C \leq 0.5$ nano-Farads. Larger or smaller values of R and C may also be used depending upon the desired operating characteristics of the particular circuit or device and the transients to which the bias supplies and coupling leads may be exposed. Stated another way, R and C should be chosen so that the RC time constant is longer than the anticipated transient pulse width or period that is likely to appear at nodes 55, 55'. Filters 50, 50' are illustrated as having two capacitances 51, 52; 51', 52' in "π" configurations with resistances 53, 53'. However, filters 50, 50' in further embodiments may omit one or the other of capacitances 51, 52; 51', 52' so that filters 50, 50' have an "L" configuration with capacitances 51, 51' and resistances 53, 53', or an "L" configuration with capacitances 52, 52' and resistances 53, 53'. This is illustrated more fully in connection with FIG. 6. Other forms of low pass filters are also useful and intended to be within the scope of the present invention. Filters 50, 50' remove high speed transients that may be present on bias supplies Vb, Vb' and associated conductors, or on Vdd and associated conductors when terminals 46, 46' are coupled to Vdd. Capacitors 51, 51' and/or 52, 52' also assist in maintaining control transistors 35, 35' in an ON state while ESD clamp 51 and core circuit 24 are energized. In a preferred embodiment, filters 50, 50' are included in some form and nodes 54, 54' are coupled via terminals 46, 46' to the nominal supply voltage (Vdd) bus for core circuit 24, in which case Vb=Vb'=Vdd, where Vdd is the supply bus voltage of core circuit 24. However, in other embodiments different bias voltage sources and/or different bias voltage values may also be used. As noted above, Vb, Vb' may be obtained from separate voltage sources or a common voltage source. Further, while separate filters 50, 50' are shown in FIG. 5, other arrangements may also be used. By way of illustration and not intended to be limiting, where it is desired that Vb=Vb', a single filter may be coupled to the voltage source Vb, Vb' and the output of the filter coupled to nodes 54, 54', as is shown for example in FIG. 6.

Figure 6:
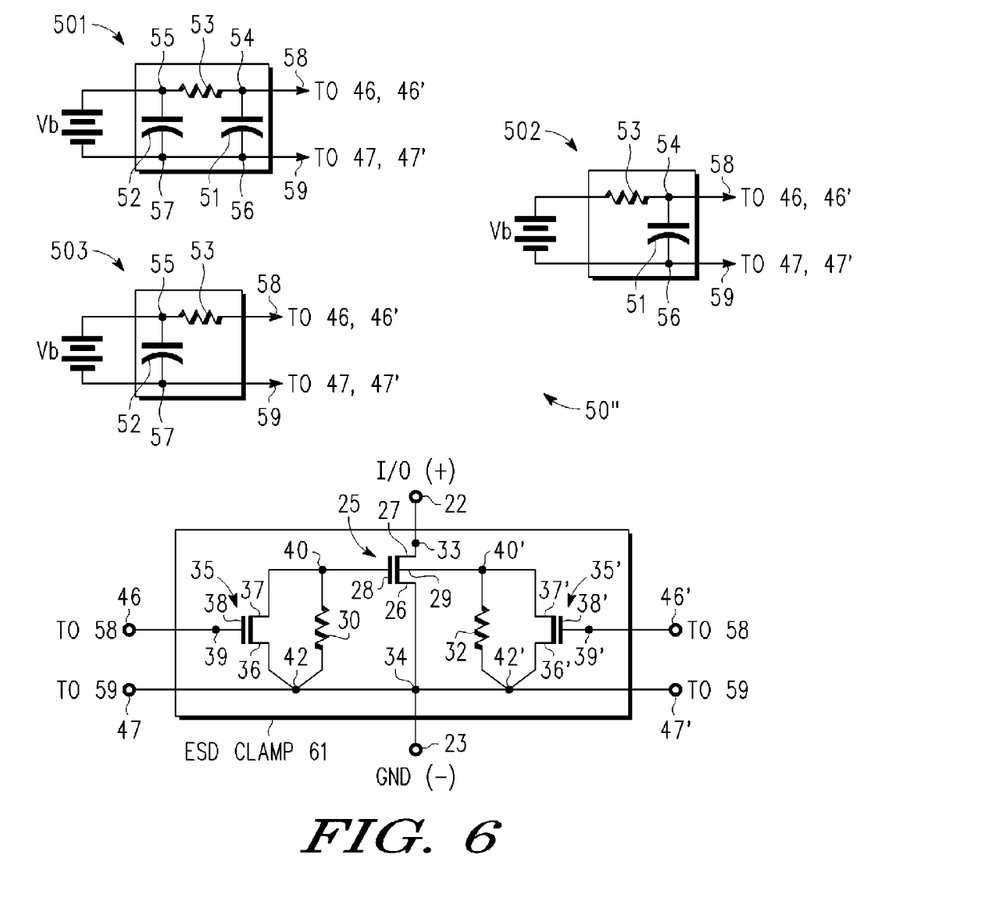
FIG. 6 is a simplified schematic diagram illustrating internal components of an ESD clamp and bias voltage system, according to a still further embodiment of the invention.

FIG. 6 is a simplified schematic diagram illustrating internal components of ESD clamp 61 and bias voltage filter system 50", according to still further embodiment of the invention and showing further details. In FIGS. 4-5 it was assumed that the return paths to bias supplies Vb, Vb' were provided by GND and not explicitly shown. In FIG. 6, such return paths are illustrated. Shown in FIG. 6 are various filters 501, 502, 503 (collectively 50″) and DC voltage sources Vb, having outputs 58, 59 that can be coupled to bias terminals 46, 46′ and 47, 47′, respectively, of ESD clamp 61, as indicated. Any one of filters 501, 502, 503 and associated bias supply Vb can be used in conjunction with ESD clamp 61, so that the filter and associated bias supply are coupled to gates 38, 38′ of control transistors 55, 55′ via nodes 39, 39′. In this example, a common bias supply Vb and filter (501, 502, or 503) are coupled to ESD clamp 61 so that both control transistors 35, 35′ receive the same bias voltage. This is convenient but in other embodiments control transistors 35, 35′ may be separately biased, depending upon the needs of the designer.

Figure 7:
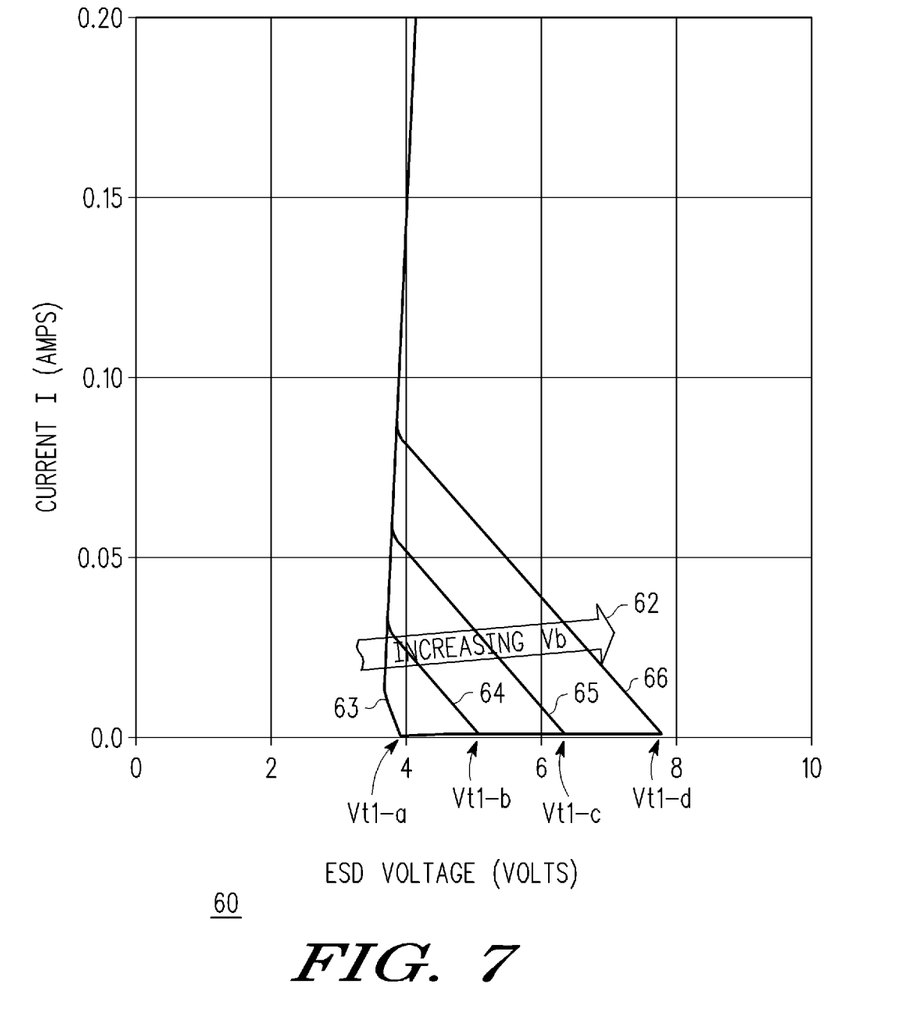
FIG. 7 is a plot of ESD current in Amperes as a function of ESD voltage in volts for the circuit of FIGS. 4-6 for different values of bias voltage Vb applied to the circuit.

FIG. 7 shows plot 60 of ESD current in Amperes as a function of ESD voltage in volts, for the circuit of FIGS. 4-6 for different values of bias voltage Vb=Vb′ applied to terminals 46, 46 (and 47, 47′). For this test, gate resistor 30 coupled to ESD transistor 25 was about 15 kilo-Ohms, body resistor 32 coupled to body 29 of ESD transistor 25 was about 20 kilo-Ohms and ESD transistor 25 had a drawn channel length of about 0.13 micrometers and channel width of about 2.7 micro-meters. As indicated by arrow 62, the observed values of Vt1 increase as the bias voltage Vb=Vb′ is increased. Trace 63 with Vt1=(Vt1-a), corresponds to Vb=Vb′=Vdd=0 volts, that is ESD clamps 41, 51, 61 and core circuit 24 are not energized, i.e., they are inactive (OFF). This is the condition that usually exists when the SC device or IC is, for example, being handled in bulk or individually by humans or by machines in the course of being assembled into an equipment circuit board. This situation arises during transport, packaging and assembly of the individual SC devices or ICs during routine shipping and equipment manufacturing operations. It is advantageous that, under these circumstances, the threshold voltage Vt1 for Vb=Vb′=Vdd=0 has its lowest value (Vt1-a). This insures that maximum protection is provided when there is no operating voltage, i.e., no Vdd is applied to the protected devices or ICs containing ESD clamp 41, 51 or 61. Thus, (Vt1-a) can be made lower than what could be tolerated during operation of the SC device or IC, since there is no risk that ESD clamp 41, 51, 61 might be activated by normal circuit operation, e.g., by a large data pulse arriving at an I/O terminal. Traces 64-66 show the response of ESD clamps 41, 51, 61 as Vb=Vb′ is increased. For Vb=Vb′=0 volts, (Vt1-a) was just under 4 volts, for Vb=Vb′=1.5 volts, (Vt1-b) was about 5 volts, and for Vb=Vb′=3.0 volts, (Vt1-c) was about 6.3 volts, and for Vb=Vb′=5 volts, (Vt1-d) was about 7.5 volts. While the test circuit was designed to operate at the comparatively low voltages shown in FIG. 6, the present invention is not limited to such voltage ranges and any desired vales or ranges of Vt1 can be provided by adjusting resistances 30, 32 and bias voltages Vb, Vb′, provided that the bias voltages do not exceed the breakdown voltage of gates 38, 38′ of control transistors 35, 35′. Still higher values and ranges of Vt1 can be obtained by cascading circuits of the type shown in FIGS. 4-6, as for example are illustrated in FIGS. 9-10.

Figure 8:
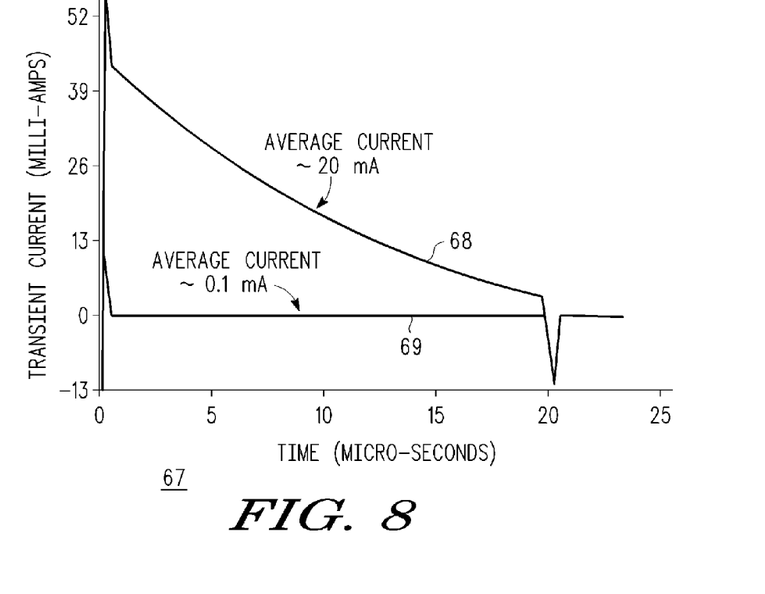
FIG. 8 is a plot of transient leakage current in milliamps as a function of time in microseconds, showing the response of various ESD clamps following a short data pulse.

FIG. 8 shows plot 67 of transient leakage current in milliamps as a function of time in microseconds, showing the current response of various ESD clamps following a short data pulse. No ESD transient is present. This simulates normal circuit operation and shows the undesirable loading that can arise during normal operation at an I/O pin with a signal present and the excess power dissipation that can arise from prior art ESD clamp 31 during normal circuit operation when no ESD transient is present. It also shows that this undesirable circuit loading and excess power dissipation are avoided by use of ESD clamps 41, 51, 61. Any current flowing through the ESD clamp during normal circuit operation with no ESD transient is present is wasted energy that undesirably contributes to Joule heating of the die or IC and power supply loading, without benefit to circuit operation. To insure that the comparative test was made using the same ESD transistor with and without control transistors 35, 35′, the operation of prior art ESD clamp 31 was simulated by disabling control transistors 35, 35′ of ESD clamps 41, 51, 61 of FIG. 4-6. Trace 68 shows the transient leakage current through the ESD clamp of FIGS. 4-6 with Vb, Vb′=0 so that control transistors 35, 35′ are turned OFF. With control transistors 35, 35′ turned OFF, these ESD clamps are electrically equivalent to prior art ESD clamp 31 during normal circuit operation. With control transistors 35, 35′ turned OFF, ESD transistors 25 of these circuits behave in the same way during normal operation of core circuit 24 as ESD transistors 25 of prior art ESD clamp 31 of FIG. 2, and exhibit the same parasitic leakage. In this test, core circuit 24 is powered up (e.g., Vdd is ON for core circuit 24) but Vb, Vb′=0 so that control transistors 35, 35′ are effectively removed from the ESD clamp circuit. It will be noted in trace 68 that the arriving data pulse on one or the other of I/O terminals 22 causes a comparatively long lasting current transient to flow through ESD transistor 25 when configured according to prior art type ESD clamp 31. The current pulse has a peak value above 52 milliamps, an average value of about 20 milliamps and takes about 20 micro-seconds to decay. This significantly increases the power dissipation in the chip or die during normal operation of core circuit 24 when a prior art type ESD clamp electrically equivalent to ESD clamp 31 of FIG. 2 is employed for ESD protection. Trace 69 shows the transient leakage current for the identical ESD transistor but with control transistors 35, 35′ turned ON by coupling Vb, Vb′ to Vdd. Under these circumstances, with the same ESD transistor 25, the peak leakage current through ESD clamp 41, 51, 61 is about 9-10 milliamps, but decays in less than about 0.5 micro-seconds to a quiescent value close to zero milliamps and has an average value of about 0.1 milliamps. The time duration of the transient disruption is reduced by a factor of about 20/0.5=40 and the average transient leakage current is reduced by a factor of about 20/0.1=200. These are very significant improvements in performance by improved ESD clamps 41, 51, 61 of FIGS. 4-6 compared to prior art ESD clamp 31 of FIG. 2.

Figure 9:
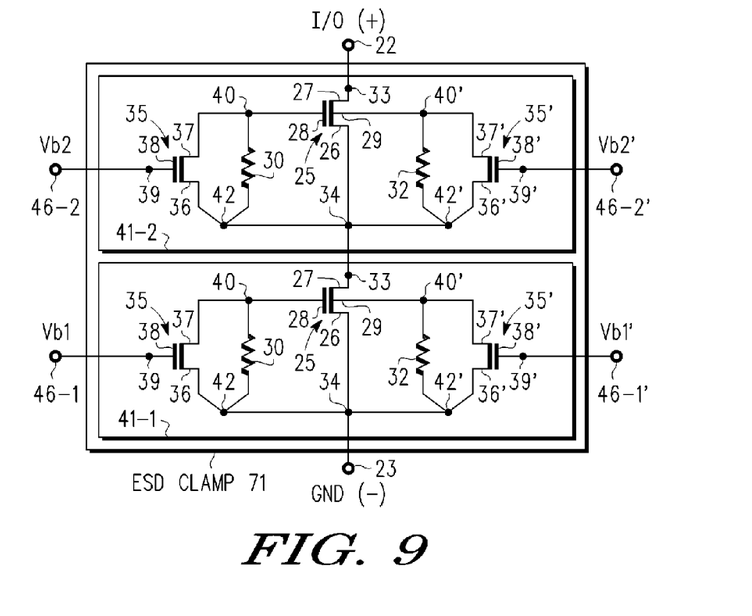
FIGS. 9-10 are simplified schematic diagrams illustrating internal components of a higher voltage ESD clamp embodying cascaded arrangements of the ESD clamps of FIGS. 4-6, according to yet further embodiments of the invention.
Figure 10:
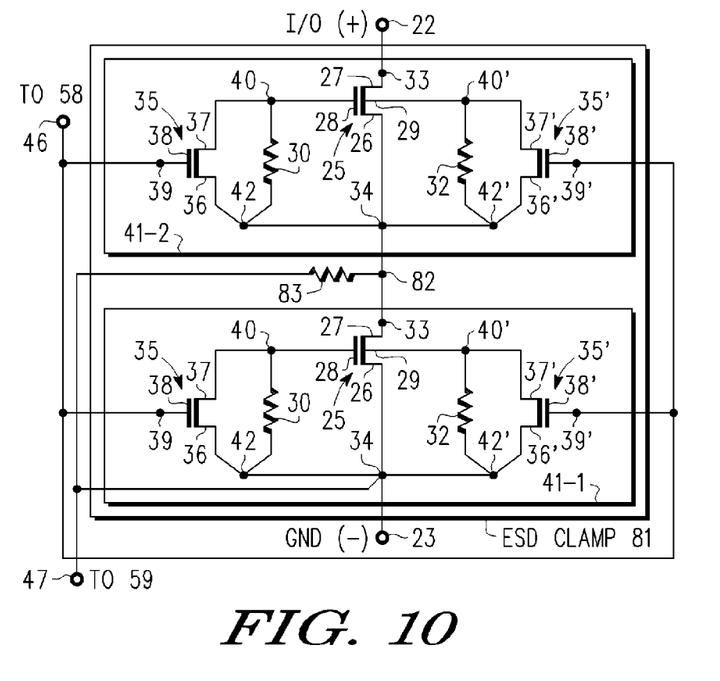

FIGS. 9-10 are simplified schematic diagrams illustrating internal components of higher voltage ESD clamps 71, 81 embodying a cascaded arrangements of ESD clamps 41, 51, 61 of FIGS. 4-6, according to yet further embodiments of the invention. For convenience of description it is assumed that cascaded ESD clamps 71, 81 comprise two serially arranged ESD clamps 41, i.e., serially coupled lower ESD clamp 41-1 and upper ESD clamp 41-2, but this is not intended to be limiting and ESD clamps 51, 61 can also be used. The same reference numbers are used for the analogous elements within ESD clamps 41-1 and 41-2 of FIGS. 9-10 (and also for ESD clamp 41-1′ of FIG. 11), but this is merely for convenience of description and not intended to be limiting or imply that the internal analogous elements (e.g., elements 25-29, 30-34, 35-42, 35′-42′, etc.) of ESD clamps 41-1, 41-2 (and 41-1′) are identical. In some embodiments, it is convenient to stack or cascade ESD clamps whose internal analogous elements are substantially identical, and in other embodiments, the various internal analogous elements of the stacked or cascaded ESD clamps, although performing analogous functions, may differ in size, shape, arrangement or other properties, according to the needs of the designer. Referring now to cascaded ESD clamp 71 of FIG. 9, node 34 of lower ESD clamp 41-1 is coupled to GND terminal 23 and node 33 of upper ESD clamp 41-2 is coupled to I/O terminal 22 and intervening nodes 33, 34 of lower and upper ESD clamps 41-1 and 41-2 are joined, that is, node 33 of lower ESD clamp 41-1 is coupled to node 34 of upper ESD clamp 41-2. The effect of having two cascaded ESD clamps forming ESD clamp 71 is to provide higher values of Vt1, approximately given by the sum of the values of Vt1 of individual ESD clamps 41-1 and 41-2. Gate nodes 39, 39' of lower and upper ESD clamp stages 41-1 and 41-2 are coupled to appropriate bias supplies via terminals 46-1, 46-1' for lower ESD clamp stage 41-1 and via terminals 46-1, 46-2' for upper ESD clamp stage 41-2. Any of the biasing arranges described herein may be used, but this is not intended to be limiting and other biasing arrangements can be used according to the desires of the ESD clamp designer and the desired properties. For example and not intended to be limiting, independent bias supplies Vb1, Vb1'; Vb2, Vb2' may be provided across nodes 39, 39' and 34 of lower and upper clap stages. Alternatively, and not intended to be limiting, bias terminals 46-1, 46-1' may be tied together and coupled to any of supply and filter arrangements 50" illustrated in FIG. 6, and terminals 46-2, 46-2' may be tied together and coupled to any of supply and filter arrangements 50" illustrated in FIG. 6 or other bias supplies having higher voltage provided for example by a charge pump or other voltage increase arrangement. Any means of appropriately biasing gate nodes 39, 39' with respect to common nodes 34 of lower and upper ESD clamp stages 41-1, 41-2 may be used. The only limit on the bias voltage applied to the gate terminals of control transistors 35, 35' is that it not exceed the breakdown voltage of the gate dielectric of transistors 35, 35', keeping in mind that Vt1 increases as the gate voltage of control transistors 35, 35' is increased.

Referring now to cascaded ESD clamp 81 of FIG. 10, node 34 of ESD clamp 41-1 is coupled to GND terminal 23 and node 33 of ESD clamp 41-2 is coupled to I/O terminal 22 and intervening nodes 33, 34 are joined via node 82, that is, node 33 of ESD clamp 41-1 is coupled via node 82 to node 34 of ESD clamp 41-2. The effect of having two cascaded ESD clamps forming ESD clamp 81 is to provide higher values of Vt1, approximately given by the sum of the values of Vt1 of individual ESD clamps 41-1 and 41-2. ESD clamp 81 also illustrates the situation where a single bias supply is used to bias control transistors 35, 35' of both ESD clamps 41-1 and 41-2, but this is not intended to be limiting and in other embodiments, any of the various biasing arrangements described herein as well as other biasing arrangements may also be used. In the example of cascaded ESD clamp 81, gate nodes 39, 39' of both ESD clamp stages 41-1 and 41-2 are tied to common bias input terminal 46, which would be coupled to terminal 58 of any of the bias supply and filter arrangements 50" shown in FIG. 6. Similarly, reference nodes 34 of ESD clamp stages 41-1 and 41-2 are coupled to bias return terminal 47, which would be coupled to terminal 59 of any of the bias supply and filter arrangements 50" of FIG. 6. During normal circuit operation (no ESD transient present), node 82 is floating since ESD transistors 25 are OFF. Hence, it is desirable to provide resistor 83 coupling node 34 of upper ESD clamp stage 41-2 to bias return terminal 47, so that the bias voltage appearing at gate nodes 39, 39' of upper ESD clamp stage 41-2 is determined.

Figure 11:
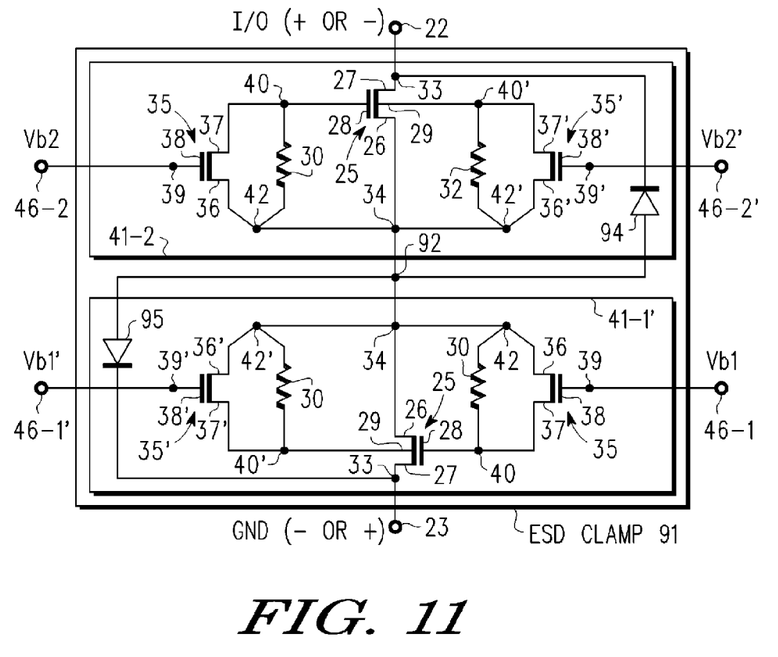
FIG. 11 is simplified schematic diagram illustrating internal components of a bidirectional ESD clamp, according to a yet still further embodiment of the invention.

FIG. 11 is a simplified schematic diagram illustrating internal components of bi-directional ESD clamp 91, according to a yet still further embodiment of the invention. Bi-directional ESD clamp 91 comprises: serially coupled ESD clamp stages 41-1' and 41-2, individually analogous to ESD clamp 41 of FIG. 4, but clamps 51, 61 could also be used. Bi-directional ESD clamp 91 differs from cascaded ESD clamps 71, 81 of FIGS. 9-10 in that lower ESD clamp 41-1' has been flipped over or rotated 180 degrees with respect to clamp stage 41-1 of FIGS. 9-10 and bypass diodes have been added. In bi-directional ESD clamp 91, node 33 of lower ESD clamp stage 41-1' is coupled to GND terminal 23, node 34 of lower ESD clamp stage 41-1' is coupled via node 92 to node 34 of upper ESD clamp 41-2, and node 33 of upper ESD clamp stage 41-2 is coupled to I/O terminal 22. Bypass diode 94 is coupled from node 34 (via node 92) to node 33 of upper ESD clamp stage 41-2 and bypass diode 95 is coupled from node 34 (via node 92) to node 33 of lower ESD clamp stage 41-1'. The function of bypass diodes 94, 95 is to bypass the ESD clamp stage with which it is associated depending on the polarity of the arriving ESD transient. For example, if a positive ESD transient arrives at I/O terminal 22 (and/or if a negative transient arrives on GND terminal 23), then upper ESD clamp stage 41-2 operates in the normal fashion and lower ESD clamp stage 41-1' is by passed by diode 95. Conversely, if a negative ESD transient arrives at I/O terminal 22 (positive transient on GND terminal 23) then lower ESD clamp stage 41-1' operates in the normal fashion and upper ESD clamp stage 41-2 is by-passed by diode 94. In this manner, bidirectional ESD protection is provided.

According to a first embodiment, there is provided an electronic device embodying an electrostatic discharge (ESD) clamp (41, 51, 61, 71, 81, 91), coupled across first (22) and second (23) terminals of a protected semiconductor device or integrated circuit (24) included in the electronic device, comprising, a first ESD transistor (25) with source (26), drain (27), gate (28) and body (29), wherein the source (26) of the first ESD transistor is coupled to the second terminal (23) and the drain (27) of the first ESD transistor is coupled to the first terminal (22), a first resistor (30) coupled between the gate (28) and the source (26) of the first ESD transistor (25), a second resistor (32) coupled between the body (29) and the source (26) of the first ESD transistor (25), and first and second control transistors (35, 35') having sources (36, 36'), drains (37, 37') and gates (38, 38'), wherein the source (36) and drain (37) of the first control transistor (35) are coupled in parallel with the first resistor (30) and the gate (38) of the first control transistor (35) is adapted to be coupled to a first bias voltage, and the source (36') and drain (37') of the second control transistor (35') are coupled in parallel with the second resistor (32) and the gate (38') of the second control transistor (35') is adapted to be coupled to a second bias voltage. According to a further embodiment, the electronic device further comprises a second ESD transistor (25) with source (26), drain (27), gate (28) and body (29), wherein the source and drain of the second ESD transistor (25) are serially coupled between the source (26) of the first ESD transistor (25) and the second terminal (23), a third resistor (30) coupled between the gate (28) and the source (26) of the second ESD transistor (25), a fourth resistor (32) coupled between the body (29) and the source (26) of the second ESD transistor (25), and third (35) and fourth (35') control transistors having sources (36, 36'), drains (37, 37') and gates (38, 38'), wherein the source (36) and drain (37) of the third control transistor are coupled in parallel with the third resistor and the gate of the third control transistor (35) is adapted to be coupled to a third bias voltage, and the source (36') and drain (37') of the fourth control transistor (35') are coupled in parallel with the fourth resistor and the gate (38') of the fourth control transistor (35') is adapted to be coupled to a fourth bias voltage. According to a still further embodiment, the drain (27) of the second ESD transistor (25) is coupled to the source (26) of the first ESD transistor (25). According to a yet further embodiment, the source (26) of the second ESD transistor (25) is coupled to the source (26) of the first ESD transistor (25). According to a still yet further embodiment, the first and second bias voltages are derived from Vdd, where Vdd is the main power rail voltage of the protected semiconductor device or integrated circuit. According to a yet still further embodiment, the electronic device further comprises, one or more low pass filters (501, 502, 503) between sources of the first and second bias voltages, and the gates (38, 38') of the first and second control transistors (35, 35'). According to a still yet further embodiment, the first and second bias voltages are derived from a common source and a single low pass filter (501, 502, 503) is provided between the common source and the gates (38, 38') of the first (35) and second (35') control transistors. According to an additional embodiment, the one or more low pass filters (501, 502, and 503) substantially pass signals of frequency less than about 800 mega-Hertz and substantially attenuate signals above about 800 mega-hertz. According to a yet additional embodiment, the one or more low pass filters (501) comprise, a first capacitor (52) with first and second terminals across an input to the filter (501), a second capacitor (51) with first and second terminals across an output (58, 59) of the filter (501), and a further resistor (53) coupling the first terminals of the first (52) and second (51) capacitors. According to a still additional embodiment, the one or more low pass filters (502, 503) each have input terminals and output terminals and the filters comprise, a capacitor (52, 51) with first and second terminals (55, 57; 54, 56) wherein one (55, 54) of the first or second terminals (55, 57; 54, 56) of the capacitor is coupled to one of the input or output (58) terminals, and a further resistor (53) coupling an other (54, 55) of the first or second terminals (55, 57, 54, 56) of the capacitor (52, 51) to an other of the input or output (58) terminals of the filter. According to a yet still additional embodiment, the first bias voltage is less than a gate breakdown voltage of the first control transistor (35) and the second bias voltage is less than a gate breakdown voltage of the second control transistor (35').

According to a second embodiment, there is provided an electronic assembly having therein a cascaded electrostatic discharge (ESD) clamp (71, 81, 91) coupled across first (22) and second (23) terminals of a protected semiconductor device or integrated circuit (24) included in the electronic assembly, comprising, at least first (41-1, 41-1') and second (41-2) serially coupled ESD clamp stages, each ESD clamp stage (41-1, 41-1'; 41-2) comprising, an ESD transistor (25) having source (26), drain (27), gate (28) and body (29) contacts, a first resistor (30) coupled between the gate (28) and source (26) contacts of the ESD transistor (25), a second resistor (32) coupled between the body (29) and source (28) contacts of the ESD transistor (25), and a first control transistor (35) having source (36), drain (37) and gate (38) contacts, wherein the source (36) and drain (37) contacts of the first control transistor (35) are coupled across the first resistor (30) and the gate (38) contact of the first control transistor (35) is adapted to be coupled to a first bias voltage, a second control transistor (35') having source (36'), drain (37') and gate (38') contacts, wherein the source (36') and drain (37') contacts of the second control transistor (35') are coupled across the second resistor (32) and the gate (38') contact of the second control transistor (35') is adapted to be coupled to a second bias voltage and wherein the source (26, 34) or drain (27, 33) contact of the ESD transistor (25) of the first ESD clamp stage (41-1, 41-1') is coupled to the second terminal (23), the drain (27, 33) contact of the ESD transistor (25) of the second ESD clamp stage (41-2) is coupled to the first terminal (22), and the drain (27, 33) or source (26, 34) contact of the ESD transistor (25) of the first ESD clamp stage (41-1, 41-1') is coupled to the source (26, 34) contact of the ESD transistor (25) of the second ESD clamp stage (41-2). According to a further embodiment, the gate (38, 38') contacts of the control transistors (35, 35') of the first ESD clamp stage (41-1, 41-1') are coupled together and adapted to be coupled to a first bias voltage and the gate (38, 36') contacts of the control transistors (35, 35') of the second ESD clamp stage (41-2) are coupled together and adapted to be coupled to a second bias voltage. According to a still further embodiment, the first and second bias voltages are different. According to a yet further embodiment, the first and second bias voltages are substantially the same. According to a still yet further embodiment, the first and second bias voltages are obtained from first and second bias supply connections (58, 59) and wherein the gates (38, 38') of the control transistors (35, 35') of the first (41-1, 41-1') and second (41-2) ESD clamp stages are adapted to be coupled to the first bias supply connection (58), and the cascaded ESD clamp (71, 81, 91) further comprises a further resistance (83) having a first end coupled to the drain (27, 33) or source (26, 34) of the ESD transistor (25) of the first ESD clamp stage (41-1, 41-1') and the source (25, 34) of the ESD transistor (25) of the second ESD clamp stage (41-2) and a second end adapted to be coupled to the second bias supply connection (59).

According to a third embodiment, there is provided an electronic apparatus having therein a bi-directional electrostatic discharge (ESD) clamp (91) coupled across first (22) and second (23) terminals of a protected semiconductor device or integrated circuit (24) within the apparatus, comprising, first and second serially coupled ESD clamp stages (41-1', 41-2), each ESD clamp stage (41-1', 41-2) comprising, an ESD transistor (25) having source (26), drain (27), gate (28) and body (29), a first resistor (30) coupled between the gate (28) and the source (26) of the ESD transistor (25), a second resistor (32) coupled between the body (29) and the source (26) of the ESD transistor (25), and a first control transistor (35) having source (36), drain (37) and gate (38), wherein the source (36) and drain (37) of the first control transistor (35) are coupled across the first resistor (30), and the gate (38) of the first control transistor (35) is adapted to be coupled to a first bias voltage, a second control transistor (35') having source (36'), drain (37') and gate (38'), wherein the source (36') and drain (37') of the second control transistor (35') are coupled across the second resistor (32) and the gate (38') of the second control transistor (35') is adapted to be coupled to a second bias voltage, a first bypass diode (95) coupled between the source (26) and drain (27) of the ESD transistor (25) of the first ESD clamp stage (41-1'), a second bypass diode (94) coupled between the source (26) and drain (27) of the ESD transistor (25) of the second ESD clamp stage (41-2), and wherein the drain (27) of the ESD transistor (25) of the first ESD clamp stage (41-1') is coupled to the second terminal (23), the drain (27) of the ESD transistor (25) of the second ESD clamp stage (41-2) is coupled to the first terminal (22), and the sources (26, 26) of the ESD transistors (25, 25) of the first (41-1') and second (41-2) ESD clamp stages are coupled together. According to a further embodiment, the first bypass diode (95) coupled between the source (26) and drain (27) of the ESD transistor (25) of the first ESD clamp stage (41-1') is oriented so that when an ESD transient arriving at the first terminal (22) is positive with respect to the second terminal (23), the first bypass diode (95) conducts, thereby causing current resulting from the ESD transient to flow primarily through the first diode (95) and substantially bypass the ESD transistor (25) of the first ESD clamp stage (41-1'), and wherein the second bypass diode (94) coupled between the source (26) and drain (27) of the ESD transistor (25) of the second ESD clamp stage (41-2) is oriented so that when an ESD transient arriving at the first terminal (22) is negative with respect to the second terminal (23), the second bypass diode (94) conducts, thereby causing the current resulting from the ESD transient to flow primarily through the second diode (94) and substantially bypass the ESD transistor (25) of the second ESD clamp stage (41-2). According to a still further embodiment, the apparatus further comprises one or more low pass filters (501, 502, 503) adapted to be serially coupled between one or both of the first and second bias voltages and the gates (38, 38') of the control transistors (35, 35'). According to a yet further embodiment, at least some of the one or more low pass filters (501, 502, 503) comprise a series resistance (53) and one or more shunt capacitances (52, 51).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic assembly having therein a cascaded electrostatic discharge (ESD) clamp coupled across first and second terminals of a protected semiconductor device or integrated circuit included in the electronic assembly, comprising:
    at least first and second serially coupled ESD clamp stages, each ESD clamp stage comprising:
        an ESD transistor having source, drain, gate and body contacts;
        a first resistor coupled between the gate and source contacts of the ESD transistor;
        a second resistor coupled between the body and source contacts of the ESD transistor; and
        a first control transistor having source, drain and gate contacts, wherein the source and drain contacts of the first control transistor are coupled across the first resistor and the gate contact of the first control transistor is adapted to be coupled to a first bias voltage;
    a second control transistor having source, drain and gate contacts, wherein the source and drain contacts of the second control transistor are coupled across the second resistor and the gate contact of the second control transistor is adapted to be coupled to a second bias voltage; and
    wherein the source or drain contact of the ESD transistor of the first ESD clamp stage is coupled to the second terminal, the drain contact of the ESD transistor of the second ESD clamp stage is coupled to the first terminal, and the drain or source contact of the ESD transistor of the first ESD clamp stage is coupled to the source contact of the ESD transistor of the second ESD clamp stage.

2. The electronic assembly of claim 1, wherein the gate contacts of the control transistors of the first ESD clamp stage are coupled together and adapted to be coupled to a first bias voltage and the gate contacts of the control transistors of the second ESD clamp stage are coupled together and adapted to be coupled to a second bias voltage.

3. The electronic assembly of claim 2, wherein the first and second bias voltages are different.

4. The electronic assembly of claim 2, wherein the first and second bias voltages are substantially the same.

5. The electronic assembly of claim 1, wherein the first and second bias voltages are obtained from first and second bias supply connections and wherein the gates of the control transistors of the first and second ESD clamp stages are adapted to be coupled to the first bias supply connection and the cascaded ESD clamp further comprises a further resistance having a first end coupled to the drain or source of the ESD transistor of the first ESD clamp stage and the source of the ESD transistor of the second ESD clamp stage and a second end adapted to be coupled to the second bias supply connection.

6. An electronic apparatus having therein a bi-directional electrostatic discharge (ESD) clamp coupled across first and second terminals of a protected semiconductor device or integrated circuit within the apparatus, comprising:
    first and second serially coupled ESD clamp stages, each ESD clamp stage comprising:
        an ESD transistor having source, drain, gate and body;
        a first resistor coupled between the gate and the source of the ESD transistor;
        a second resistor coupled between the body and the source of the ESD transistor;
        a first control transistor having source, drain and gate, wherein the source and drain of the first control transistor are coupled across the first resistor, and the gate of the first control transistor is adapted to be coupled to a first bias voltage;
        a second control transistor having source, drain and gate, wherein the source and drain of the second control transistor are coupled across the second resistor and the gate contact of the second control transistor is adapted to be coupled to a second bias voltage;
        a first bypass diode coupled between the source and drain of the ESD transistor of the first ESD clamp stage;
        a second bypass diode coupled between the source and drain of the ESD transistor of the second ESD clamp stage; and
    wherein the drain of the ESD transistor of the first ESD clamp stage is coupled to the second terminal, the drain of the ESD transistor of the second ESD clamp stage is coupled to the first terminal, and the sources of the ESD transistors of the first and second ESD clamp stages are coupled together.

7. The electronic apparatus of claim 6, wherein the first bypass diode coupled between the source and drain of the ESD transistor of the first ESD clamp stage is oriented so that when an ESD transient arriving at the first terminal is positive with respect to the second terminal, the first bypass diode conducts, thereby causing current resulting from the ESD transient to flow primarily through the first diode and substantially bypass the ESD transistor of the first ESD clamp stage, and wherein the second bypass diode coupled between the source and drain of the ESD transistor of the second ESD clamp stage is oriented so that when an ESD transient arriving at the first terminal is negative with respect to the second terminal, the second bypass diode conducts, thereby causing current resulting from the ESD transient to flow primarily through the second diode and substantially bypass the ESD transistor of the second ESD clamp stage.

8. The electronic apparatus of claim 6, further comprising one or more low pass filters adapted to be serially coupled between one or both of the first and second bias voltages and the gates of the control transistors.

9. The electronic apparatus of claim 8, wherein at least some of the one or more low pass filters comprise a series resistance and one or more shunt capacitances.

10. An electronic assembly, comprising:
a protected semiconductor device or integrated circuit having first and second terminals;
a first electrostatic discharge (ESD) clamp stage coupled between the first and second terminals; and
a second ESD clamp stage coupled between the first and second terminals in series with the first ESD clamp stage, the second ESD clamp stage comprising:
an ESD transistor having a source, a drain, a gate, and a body, the drain and source of the ESD transistor configured to be coupled to first and second potentials, respectively;
a first control transistor having a source, a drain, and a gate, the drain of the first control transistor coupled to the gate of the ESD transistor, the source of the first control transistor configured to be coupled to the second potential;
a second control transistor having a source, a drain, and a gate, the drain of the second control transistor coupled to the body of the ESD transistor, and the source of the second control transistor configured to be coupled to the second potential;
a first resistor coupled to the gate of the ESD transistor and configured to be coupled to the second potential, the first resistor coupled in parallel with the first control transistor;
a second resistor coupled to the drain of the ESD transistor and configured to be coupled to the second potential, the second resistor coupled in parallel with the second control transistor; and
first and second bias terminals coupled to the gates of the first and second control transistors, respectively, and configured to receive first and second bias voltages during operation of the electronic assembly.

11. The electronic assembly of claim 10, wherein the second ESD clamp stage is configured such that the first and second bias voltages can be adjusted to change the impedance between the second terminal and the gate of the first ESD transistor and the impedance between the second terminal and the body of the first ESD transistor to actively control the activation voltage of the first ESD transistor during operation of the electronic assembly.

12. The electronic assembly of claim 10, wherein the first and second control transistors are configured (i) to reside in an OFF state and impart the ESD transistor with a first predetermined activation voltage when the first and second bias voltages have a predetermined low value, and (ii) to switch to an ON state and impart the ESD transistor with a second predetermined activation voltage greater than the first predetermined activation voltage when the first and second bias voltages have a predetermined high value.

13. The electronic assembly of claim 10, wherein the second ESD stage is configured such that the activation voltage of the first ESD transistor increases as the bias voltages applied to the first and second control transistors are increased.

14. The electronic assembly of claim 10, wherein the first and second bias terminals are configured to be coupled to common bias supply.

15. The electronic assembly of claim 14, wherein the first ESD clamp stage comprises third and fourth bias terminals configured to be coupled to the common bias supply.

16. The electronic assembly of claim 10, wherein the second ESD clamp stage further comprises a bypass diode coupled between the source and drain of the ESD transistor.

17. The electronic assembly of claim 10, wherein the drain of the second ESD transistor is coupled to the source of the first ESD transistor, and wherein the source of the second ESD transistor is coupled to the source of the first ESD transistor.

18. The electronic assembly of claim 10, wherein the first and second bias voltages are derived from Vdd, where Vdd is the main power rail voltage of the protected semiconductor device or integrated circuit.

19. The electronic assembly of claim 10, wherein the second ESD clamp stage further comprises:
a first low pass filter coupled between the first bias terminal and the gate of the first control transistor; and
a second low pass filter coupled between the second bias terminal and the gate of the second control transistor.

20. The electronic assembly of claim 10, wherein the first bias voltage is less than a gate breakdown voltage of the first control transistor and the second bias voltage is less than a gate breakdown voltage of the second control transistor.

* * * * *